United States Patent [19]
Liu

[11] Patent Number: 5,254,497
[45] Date of Patent: Oct. 19, 1993

[54] METHOD OF ELIMINATING DEGRADATION OF A MULTILAYER METALLURGY/INSULATOR STRUCTURE OF A VLSI INTEGRATED CIRCUIT

[75] Inventor: Chwen-Ming Liu, Shinchu, Taiwan

[73] Assignee: Taiwan Semiconductor Manufacturing Company, Hsinchu, Taiwan

[21] Appl. No.: 908,089

[22] Filed: Jul. 6, 1992

[51] Int. Cl.$^5$ .................. H01L 21/268; H01L 21/441
[52] U.S. Cl. .................... 437/173; 437/195; 437/231; 437/238; 437/978
[58] Field of Search .............. 437/195, 173, 978, 231, 437/238

[56] References Cited

U.S. PATENT DOCUMENTS 4,986,878  1/1991  Malazgirt et al. .............. 437/231 X
5,003,062  3/1991  Yen ................................... 437/231

OTHER PUBLICATIONS

Pramanik et al., "Field Inversion in CMOS Double Metal Circuits . . . ", VMIC Conference, Jun. 12–13, 1989, pp. 454–462.

*Primary Examiner*—John S. Maples
*Attorney, Agent, or Firm*—George O. Saile

[57] ABSTRACT

A method is described for forming multiple metal, spin-on-glass metallurgy with substantially free field inversion. A pattern of device regions are formed with a pattern of gate dielectric and gate electrode structures which are isolated from one another. A first passivation layer is formed over the patterns. The multilayer metallurgy is formed thereover by opening a pattern of openings through the passivation layer to some of the regions. A first metallurgy layer is deposited and patterned in contact with the pattern of openings. A first silicon oxide via dielectric layer is formed over the pattern of first metallurgy layer. A spin-on-glass layer is formed over the via dielectric layer and the layer is cured. A second oxide via dielectric layer is formed thereover. Openings are formed in the second via, spin-on-glass and first via layers. A second metallurgy layer is deposited and patterned in contact with the openings to make contact to the first metallurgy. A second dielectric layer is formed thereover. Finally, the structure is illuminated with ultra violet radiation for a time sufficient to neutralize the positive charges in the structure to give a substantially free field inversion integrated circuit.

20 Claims, 2 Drawing Sheets

METHOD OF ELIMINATING DEGRADATION OF A MULTILAYER METALLURGY/INSULATOR STRUCTURE OF A VLSI INTEGRATED CIRCUIT

BACKGROUND OF THE INVENTION (1) Field of the Invention

This invention relates in general to semiconductor device processing, and more particularly to a method of fabricating a multilayer metallurgy/insulator structure of a very large scale integrated (VLSI) circuit.

(2) Description of the Prior Art

Degradation of polysilicon load resistance in a double polysilicon interconnection metallurgy system, particularly in fabricating double polysilicon 4 transistor static random access memory devices. The fabrication of such devices depend on the use of multilayer metallurgy systems which contain a sandwich insulation composite layer of silicon oxide, spin-on-glass and silicon oxide, and the process steps for forming such silicon layers that utilize plasma enhanced oxidation.

Spin-on-glass is a very desirable material to be used in such methods and resulting structures to overcome the irregularity or substantially nonplanar surfaces of the first level of metallurgy. This irregular or nonplanar surface problem causes loss of resolution in the lithographic masking processing. The problem increases with higher level of metallurgy.

These problems have been recognized in the prior art and attempts have been made to overcome these topographical problems principally in the one micron and above feature dimensions. These techniques can be generally grouped in categories of planarization either involving etchback or nonetchback techniques.

In the case of etchback processing, typically a coating is formed on top of the irregular surfaces by an means of spin-on-glass or thermoplastic deposition techniques which produces a planar surface. A plasma, reactive or chemical wet etching is used uniformly across the planar surface to remove the deposited layer and the tops of the irregular humps or the like to produce a planar surface at the desired depth.

In the early nonetchback processing, the usual technique was to heat the dielectric layer, which was typically glass until the flow of the glass reduced the irregularities.

More recently the nonetchback planarization using a spin-on-glass sandwich has found interest at the about one micron feature dimension integrated circuit processing. This technique is described in U.S. Pat. No. 5,003,062 to Daniel L. Yen and assigned to the same assignee of the present invention. In this patent a sandwich dielectric structure is formed and used in one micron or less processing of spin-on-glass sandwiched between two silicon oxide layers. The spin-on-glass layer functions as the means for planarizing the irregularities.

In the Yen U.S. Pat. No. 5,003,062, spin-on-glass that has been cured still remains in the final product. However, workers in the field such as A. Malazgirt et al U.S. Pat. No. 4,986,878 has found that spin-on-glass even after curing by conventional techniques causes reliability problems, such as the presence therein of mobile ions, e.g. sodium to the point that they use the spin-on-glass in an etchback process for planarization and then completely remove the remaining material. Then a conventional insulator is deposited.

In the paper entitled "FIELD INVERSION IN CMOS DOUBLE METAL CIRCUITS DUE TO CARBON BASED SOGS" by D. Pramanik et al, a further discussion of the reliability problems in the use of spin-on-glass (SOG) is considered. They conclude that the use of SOG must be heavily restricted to overcome field inversion, that is a positive charge build up between the SOG layer and the other dielectric layers. They state that SOG must be purely inorganic phosphosilicate glass, since organic based SOG emanates hydrogen. Further, the require that etchback be used to reduce the thickness of the SOG to the bare minimum in the final product. Still further, they require that the layer covering the SOG be formed of a material that does not liberate hydrogen, such as silicon dioxide. Normal processes for depositing silicon nitride or oxynitride do liberate hydrogen.

In the U.S. Pat. application Ser. No. 07/743,779 Aug. 12, 1991 by L. S. Tsai et al entitled "Method and Resulting Device for Field Inversion Free Multiple Layer Metallurgy VLSI Processing" it is proposed that the inversion problem can be overcome by the incorporation of a specific dielectric between the Via 1 dielectric layer and the spin-on-glass (SOG) layer. This is a successful technique.

In another U.S. Pat. application Ser. No. 07/825,371 dated Jan. 24, 1992 by K. M. Lin et al entitled "A Nitrogen Treatment to Prevent Field Device Leakage in VLSI Processing" it is proposed that the inversion problem can be overcome by use of a nitrogen treatment of the first silicon oxide layer. This has been successful.

Accordingly it is a principal object of the present invention to provide a novel process for eliminating or substantially eliminating degradation of polysilicon metallurgy used in semiconductor devices.

Another object of the present invention is to provide a novel process for dispelling positive electrical charges in the multilayer metallurgy structures of VLSI circuits that would otherwise degrade the electrical characteristics of such devices without changing the established processes.

SUMMARY OF THE INVENTION

In accordance with the present invention, and the above objects of the invention, there is provided a novel process wherein degradation of the multilayer metallurgy/insulator structure in a semiconductor device can be eliminated without changing the processing steps, but by adding a step of illuminating the device with ultra violet radiation.

A method is described for forming multiple metal, spin-on-glass multilayer metallurgy for a one micrometer or less feature size integrated circuit with substantially free field inversion. A semiconductor substrate is provide having a pattern of field effect device source/drain regions therein with a pattern of gate dielectric and gate electrode structures associated therewith and a pattern of field isolation structures at least partially within the semiconductor substrate electrically separating certain of these source/drain regions from one another. A first passivation layer is formed over the surfaces of the patterns. The multilayer metallurgy is formed thereover by opening a pattern of openings through the passivation layer to at least some of the source/drain regions. A first metallurgy layer is deposited and patterned in contact with the pattern of openings. A first silicon oxide via dielectric layer is formed over the pattern of first metallurgy layer. A spin-on-glass layer is formed over the via dielectric layer and the layer is cured. A second silicon oxide via dielectric layer is formed over the spin-on-glass layer. A pattern of openings is formed in the second via layer, the spin-on-glass layer, and the first via layer. A second metallurgy layer is deposited and patterned in contact with the pattern of openings to make electrical contact with the first metallurgy layer. A second passivating dielectric layer is formed over the second metallurgy layer. Finally, the structure is illuminated with ultra violet radiation for a time sufficient to neutralize the positive charges in the multilevel metallurgy structure wherein the multilevel metallurgy integrated circuit with substantially free field inversion is completed.

DESCRIPTION OF THE PREFERRED EMBODIMENT

Figure 1:
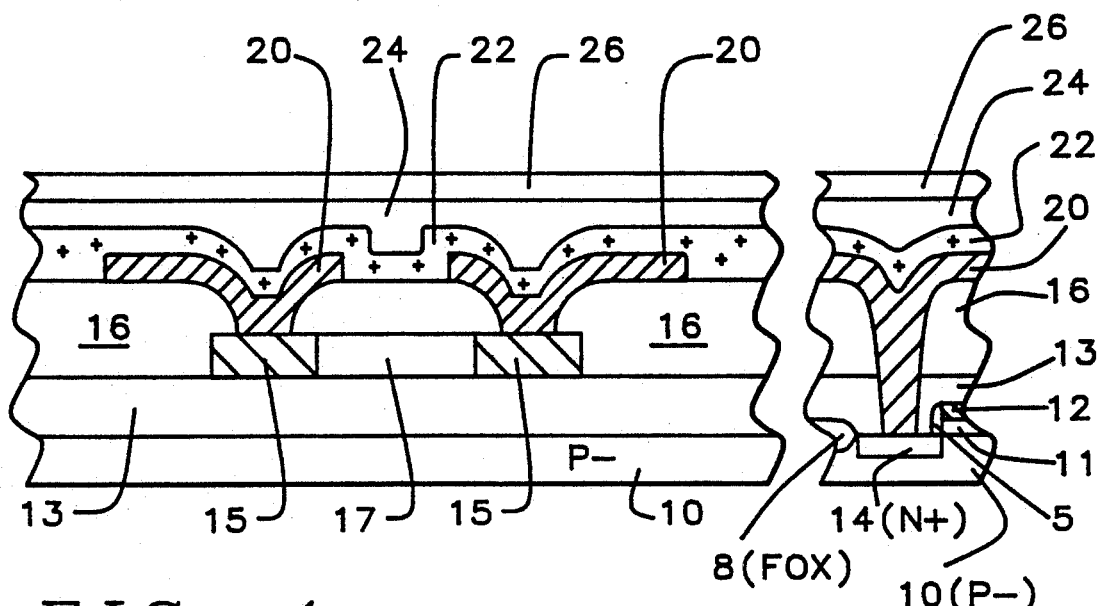
FIG. 1 is a vertical cross sectional view, in broken section and in greatly enlarged scale, of a typical semiconductor device structure, which is likely to experience multilayer metallurgy/insulator structure degradation.

Referring now to the aforedescribed figures of the drawings, and FIG. 1 in particular, there is shown an illustration of a partially completed, single field effect transistor (FET) having a polysilicon resistor structure. The first series of steps involve the formation of the dielectric isolation regions 8 for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 8. Then semiconductor devices can be provided in the silicon mesas according to the following processes.

The surface of the silicon substrate 10 is thermally oxidized to form the desired gate oxide 11 thickness. The preferred thickness is between about 70 to 200 Angstroms. The polysilicon layer 12 is blanket deposited by LPCVD (Low Pressure Chemical Vapor Deposition) method. The preferred thickness of the polysilicon layer 12 is between about 3000 to 4400 Angstroms. The polysilicon layer 12 is ion implanted with phosphorous or arsenic ions by conventional methods and dosages to render the polysilicon layer conductive or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 8 surfaces or elsewhere as seen in FIG. 1.

The source/drain structure of the MOS FET may now be formed by the following steps. The FIG. 1 illustrates the formation of N channel FET integrated circuit device wherein the substrate or well is doped as P−. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the device regions, typically source/drain regions 14 in the substrate as of N+ dopants. Lithographic masks may be required to protect the areas not to be subjected to that particular N ion implantation. The formation of the lithographic masks are done by conventional lithography and etching techniques. Although not illustrated for simplicity sake, lightly doped drain structures can be formed using the conventional and well known techniques. Sidewall spacer structures 5 and N-regions which are used in this process are shown in the drawings.

Figure 4:
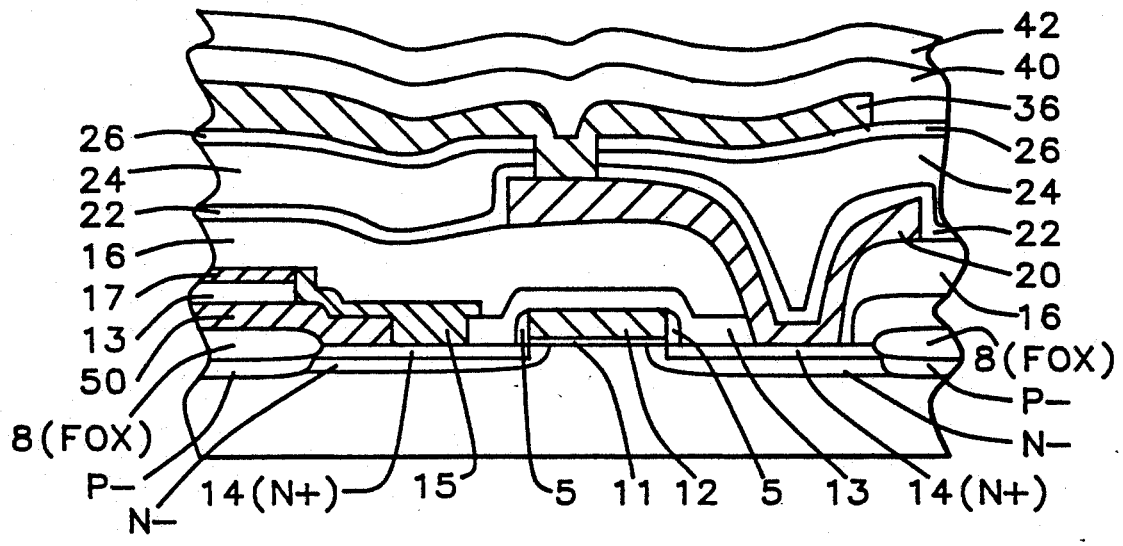
FIG. 4 is a cross-sectional schematic drawing of a double polysilicon, double metal static RAM device.

The N+ source/drain ion implantation uses typically Arsenic, As75 with a dose of between about 1 E 15 to 6 E 15 atoms/cm.$^2$ and energy of between about 70 to 100 Kev. to complete the source/drain regions 14 of the N channel MOS FET integrated circuits device as seen in the FIGS. 1 and 4.

After the device formation, the surface silicon oxide is removed from the source/drain regions and a first polysilicon layer 50 is deposited and patterned as seen in FIG. 4. A silicon oxide layer 13 is deposited as an insulating layer. This layer may be formed by any of the known techniques such as low pressure CVD, atmospheric pressure CVD, plasma enhance CVD or thermally grown. Then a contact layer is formed by opening by dry etching for the connections of second polysilicon layer resistor layer, source/drain regions 14 and first polysilicon layer 50. The second polysilicon layer is then deposited in a low pressure CVD process with temperature of between about 600° to 630° C. The thickness of this layer is between about 1000 to 2500 Angstroms. This layer is then patterned and isotropically etched for stringer sidewalls. The second polysilicon layer is then adjusted by ion implantation at 1 E 13 to 1 E 14 or kept intrinsic to the desired resistance value. The ion implantation can be done before or after the patterning step. A masking layer for interconnection is used to block the lightly doped or intrinsic region 17 of the second polysilicon. The rest of the second polysilicon layer 15 is heavily doped by ion implantation at 1 E 15 to 6 E 15.

A passivation or insulating layer 16 is now formed over the surfaces of the patterns. This layer may be composed of multilayers such as a thin layer of silicon oxide and a much thicker layer of borophophosilicate glass, phosphosilicate glass or similar insulating layer. The operational thicknesses of these layers are between about 800 to 1400 Angstroms for the oxide layer and between about 2000 to 8000 or more Angstroms for the glasseous layer. These layers are typically deposited by chemical vapor deposition in low pressure or atmospheric pressure, or in a plasma enhanced reactive chamber.

As seen in the FIGS., the contact windows are openings are formed through the insulating structure to the source/drain regions 14. Conventional lithography and etching techniques are used to form this pattern of openings.

The first metallurgy contact layer 20 is now deposited over the surface of the structure and within the pattern of contact openings to the source/drain regions 14 and to the resistor 15, 17 contact regions. The metallurgy is preferably Aluminum/silicon/copper having a thickness of between about 5000 to 10,000 Angstroms. However, other possible metallurgy include polysilicon, titanium, titanium/tungsten, titanium nitride or the like. The preferred method of depositing this metallurgy is by sputtering under the processing conditions of about 2 to 8 kilowatts of power, 25° to 450° C., and 0.1 to 2 Pascal. However, other possible methods of deposition include chemical vapor deposition. The metallurgy is now patterned into the desired conductive lines by conventional lithography and etching techniques to form the pattern of metal layer 20 in FIG. 1.

Figure 2:
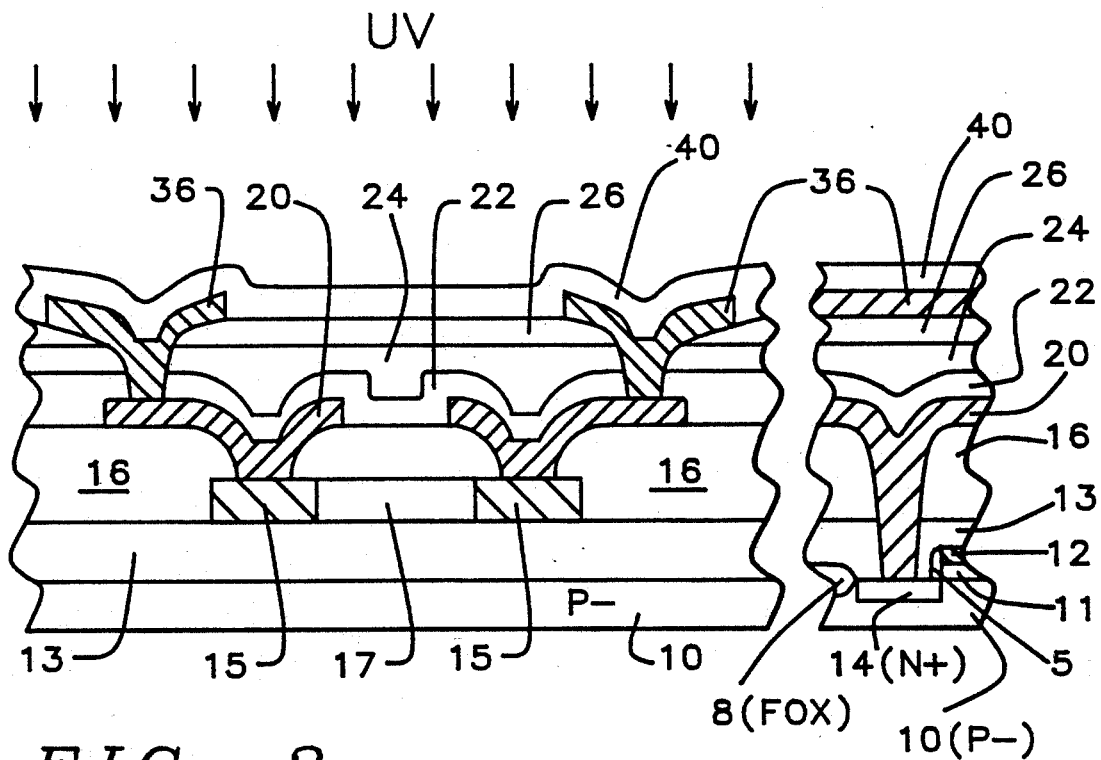
FIG. 2 is also a vertical cross sectional view of a semiconductor device provided with a polysilicon resistor, which illustrates the method of our invention for eliminating degradation.

The important planarization and dielectric layered structure between the first metallurgy layer pattern 20 and the second metallurgy layer pattern 36 which is shown in FIG. 2.

The usual first dielectric silicon oxide layer 22 of the spin-on-glass sandwich planarization structure is now formed above the first metallurgy pattern 20. It is typically in the range of between about 1000 to 4000 angstroms in thickness. This layer is deposited either by the silane method or by the TEOS method. The following is the silane method process conditions of pressure of about 2.95 Torr, power of about 180 watts, temperature of about 400° C., spacing of about 270 mils, silane of about 32 ccm, and dinitrogen oxide ($N_2O$) of 900 ccm. However, TEOS method is preferred to give the best step coverage over the surfaces being deposited thereon.

The spin-on-glass materials and how they are processed are critical to the success of the process for planarization of integrated circuits as described in the above cited in the Daniel L. Yen Patent. The most useful materials are silicates—$Si(OH)_4$ and siloxanes —$(RO)nSi(OH)_{4-n}$. These types of materials are generally known and available. Examples of the silicate type is OCD Type 2 made by Tokyo Okha Corp. and siloxane type is OCD Type 6 made by Tokyo Okha Corp. It is possible to use multiple coating of spin-on-glass. Each spin-on-glass coating is less than about 0.3 micrometers and preferably between about 0.08 and 0.2 micrometers. The more coatings that are used, the better the planarity. The material to be applied is thoroughly mixed in a suitable solvent which is usually a combination of a high boiling point solvent and a low boiling point solvent.

The preferred low boiling point solvents are methanol, ethanol, and propanol. The middle boiling point solvents are buthanol, penthanol, hexanol and methyl cellosolve. The high boiling point solvents are butyl cellosolve, propylene glycol, diethylene glycol and Carbindol. Other potential vehicles or solvents are NMP, HMPA, N.N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. At this point, the critical vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass (SOG) layer 34 is formed.

The final step in the making of the spin-on-glass layer is curing. Curing is a high temperature heating step to cause the breakdown of the silicate or siloxane material to a silicon dioxide like cross linked material. Water in the form of steam is the major reaction product of this reaction. The silicate spin-on-glass is cured at about 390° to 420° C. and siloxane spin-on-glass is cured at about 450° C. in nitrogen. The spin-on-glass (SOG) layer 34 is now complete.

The second via dielectric layer 26 is now formed on top of the SOG layer 24. This layer is formed in a similar manner as was the first via layer 22. This layer can be deposited by either the TEOS or the silane method. The preferred thickness of this layer is between about 2000 to 6000 Angstroms and the preferred material is silicon oxide.

Openings are now made through the second via layer 26, the SOG layer 34, barrier layer 23, the first via layer 22 to the first metallurgy layer 20. These openings are made using conventional lithography and with the preferred etching conditions at a pressure of 800 mtorrs, power of 750 watts, gap of 0.8 cm., argon flow of 400 ccm, carbon tetrafluoride flow of 23 ccm, and $CHF_3$ flow of 12 ccm.

The second metallurgy contact layer 36 is now deposited over the surface of the structure and within the pattern of contact openings to the first metallurgy layer 20. The metallurgy is preferably aluminum/silicon/copper having a thickness of between about 5000 to 11,000 Angstroms. However, other possible metallurgy include polysilicon, titanium, titanium/tungsten, titanium nitride or the like. The preferred method of depositing this metallurgy is by sputtering under the same processing conditions as given for the first metallurgy layer 20. However, other possible methods of deposition include chemical vapor deposition as is known in the art. The metallurgy is now patterned into the desired conductive lines by conventional lithography and etching techniques to form the pattern of metal layer 36 in FIG. 2. Plasma enhanced silicon oxide layer 40 is now deposited over the second metallurgy 36.

The critical process steps to overcome inversion caused degradation in the multilayer metallurgy and insulator layers. The structure is illuminated, as shown in FIG. 2 by ultra violet light. The exposure involves the use of a grid lamps (mercury lamp) having a typical peak intensity of about 18500 milli watts/ square centimeters. The distance of the light to the wafer is about 10 cm. The operating conditions needed to remove the positive charge that degrades the integrated circuit structure is a dosage of between about 5 watt-seconds/square cm. to 30 watt-seconds/square cm.; a time of between about 5 to 30 minutes; and using a ultra violet wavelength of about 254 nanometers.

The integrated circuit may now be completed with higher levels of metallurgy and passivation as is known to those skilled in the art or similar additional multilevel metallurgy layers as described above are repeated to make triple or higher metallurgy levels on the integrated circuit structure.

Figure 3:
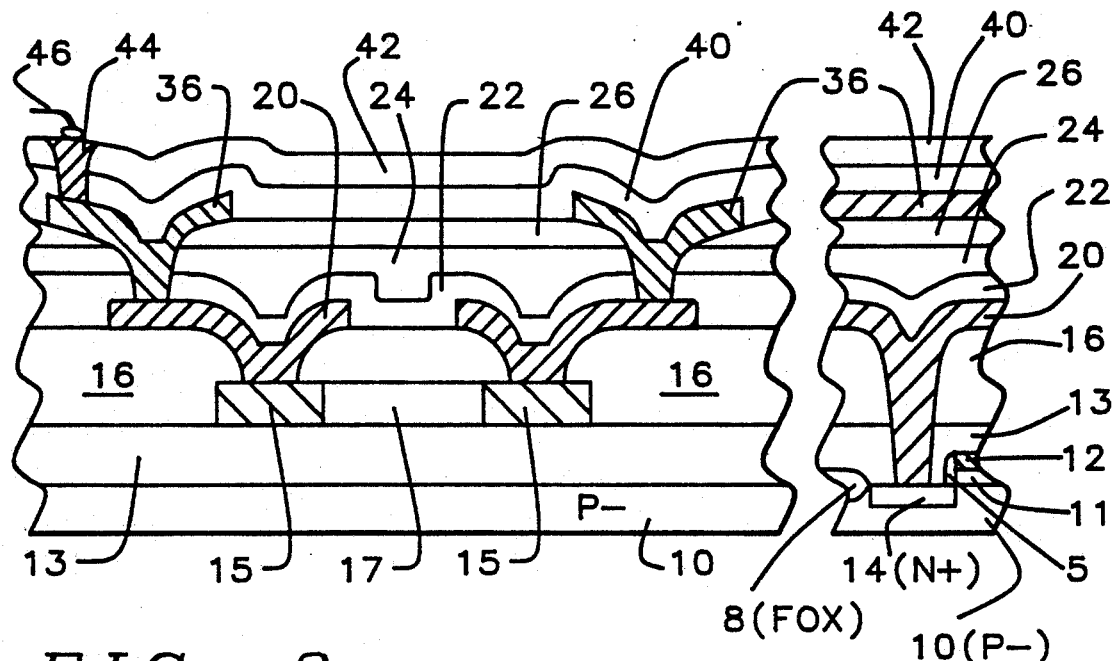
FIG. 3 shows the final step in our process for making an inversion free multilayer metallurgy/insulating structure.

FIG. 3 shows the completion of one structure wherein a second passivation layer 42, such as plasma enhanced silicon nitride layer 42 is formed over layer 40. Openings are made in layers 40, 42 to the second metallurgy layer 36 using conventional lithography and etching techniques. Metallurgy contacts 44 are made to the metallurgy 36. A gold bond or the like 46 is the final contact to off chip circuits as is known in the art.

FIG. 4 shows a schematic cross-sectional representation of a double polysilicon double metal static random access memory device made by the process of the present invention. It features a resistor having its heavily doped regions 15 connected to a source/drain region 14 and to a polysilicon layer 50 which also contacts the source/drain region 14. The intrinsic or lightly doped polysilicon resistor portion 17 is also in contact with the region 15. The illumination of ultra violet light is done to remove the positive charge problem in layer 22 before the passivation layer 42 is formed. Alternatively, where the passivation layer is highly transparent, such as silicon nitride or oxynitride the illumination can be done after the passivation layer has been deposited.

The following Examples are given to show the important features of the invention and to aid in the understanding thereof and variations may be made by one skilled in the art without departing from the spirit and scope of the invention.

EXAMPLES

The Examples were made using MOS field effect transistor test devices with a polysilicon resistor of the type shown in the FIGS. 1–3. The resistance load values given in the following TABLE I is in giga ohm per square. The UV light exposure used a grip mercury lamp having a wattage of 18500 milli watts/square cm. and a wavelength of 254 nanometers. The exposure was for 15 minutes in TABLE I.

TABLE I

| Example | @ Metal I | @ Metal II (w/o UV) | @ Metal II (with UV) |
|---|---|---|---|
| 1 | 368.2 + 79.6 | 1.85 + 1.17 | 132.0 + 40.9 |
| 2 | 412.6 + 105.2 | 1.241 + 0.623 | 160.8 + 86.3 |
| 3 | 301.1 + 90.2 | 1.848 + 2.963 | 592.6 + 149.0 |
| 4 | 499.8 + 95.1 | — | 578.4 + 112.7 |

It is seen that the resistance measured after the polysilicon resistor measured after the passivation oxide layer 40 (@ Metal II without UV exposure) is degraded substantially from the resistance measured after the Metal I was deposited. The same resistance measurement was substantially returned to the normal desired values after the 15 minute UV exposure of the structure as seen in the last column of TABLE I.

The Example 2 wafer was exposed to UV radiation for 15; 20; 25 and 35 minutes and under the conditions above. The resistance was measured as given in TABLE II.

TABLE II

| | 15 min. | 20 min. | 25 min. | 35 min. |
|---|---|---|---|---|
| Example 2 | 160.8 + | 180.4 + | 191.2 + | 181.5 + |
| | 86.3 | 43.2 | 19.1 | 42.8 |

It is seen from TABLE II that after a certain time the resistance saturates and further exposure to UV is of little consequence. That UV exposure of saturation is about 20 minutes.

While the invention has been particularly shown and described with reference to the preferred embodiments thereof, it will be understood by those skilled in the art, that various changes in form and details may be made without departing from the spirit and scope of the invention.

What is claimed is:

1. A method for forming multiple metal, spin-on-glass multilayer metallurgy for a one micrometer or less feature size integrated circuit with substantially free field inversion comprising:

providing a semiconductor substrate having a pattern of field effect device source/drain regions therein with a pattern of gate dielectric and gate electrode structures associated therewith and a pattern of field isolation structures at least partially within said semiconductor substrate electrically separating certain of these source/drain regions from one another;

forming a first passivation layer over the surfaces of said patterns; and forming said multilayer metallurgy thereover by opening a pattern of openings through said passivation layer to at least some of said source/drain regions, depositing and patterning a first metallurgy layer in contact with said pattern of openings;

forming a first silicon oxide via dielectric layer over said pattern of first metallurgy layer;

forming a spin-on-glass layer over said via dielectric layer and curing the layer;

forming a second silicon oxide via dielectric layer over said spin-on-glass layer;

forming a pattern of openings in said second via layer, said spin-on-glass layer, and said first via layer;

depositing and patterning a second metallurgy layer in contact with said pattern of openings to make electrical contact with said first metallurgy layer;

forming a second passivating dielectric layer over said second metallurgy layer; and illuminating the structure with ultra violet radiation for a time sufficient to neutralize charges in the multilevel metallurgy structure wherein said multilevel metallurgy integrated circuit with substantially free field inversion is completed.

2. The method of claim 1 wherein said first passivation layer is composed of a composite layer of silicon oxide and a thicker layer of borophosphosilicate glass.

3. The method of claim 2 wherein said thickness of said silicon oxide is between about 800 to 1400 Angstroms and said borophophosilicate glass is between about 2000 to 8000 Angstroms.

4. The method of claim 1 wherein said illumination with ultra violet light lasts for less than about 5 minutes.

5. The method of claim 1 wherein said first silicon oxide via layer is formed by a plasma enhanced chemical vapor deposition process which causes said field inversion.

6. The method of claim 5 wherein said first silicon oxide layer has a thickness of between about 1000 to 4000 Angstroms.

7. The method of claim 1 wherein there is a polysilicon resistor structure within the said device that is connected to said first metallurgy layer and is degraded due to said field inversion and has its normal resistance restored by said illumination.

8. The method of claim 5 wherein said chemical vapor deposition process has the conditions of a low pressure, about 400° C., and a silane and oxidizing atmosphere.

9. The method of claim 1 wherein said spin-on-glass is a silicate type material and has an unetched thickness of between about 1500 to 3500 Angstroms when said second via layer is formed thereover.

10. The method of claim 1 wherein said spin-on-glass is a siloxane type material and has an unetched thickness of between about 1500 to 3500 Angstroms when said second via layer is formed thereover.

11. The method of claim 1 wherein said first metallurgy layer is aluminum and is between about 5000 to 10,000 Angstroms in thickness and said second metallurgy layer is aluminum and is between about 5000 to 11,000 Angstroms in thickness.

12. A method of substantially eliminating degradation of semiconductor devices and structures within a multilayer metallurgy structure, caused by plasma enhanced process steps used in fabrication of the devices which result in unwanted positive charges comprising;

providing a semiconductor substrate having said semiconductor devices and structures within a multilayer metallurgy structure wherein there is a multilayer insulating layer between two layers of metallurgy which insulating layer includes a first layer of silicon oxide, a spin-on-glass layer and a second layer of silicon oxide;

subjecting the devices to a process step that exposes it to a plasma environment which introduces said positive charges in a polysilicon resistor which is part of said semiconductor devices;

illuminating the structure with ultra violet radiation for a time sufficient to neutralize said positive charges in the said polysilicon resistor to thereby overcome the degradation.

13. The method of claim 12 wherein said illumination with ultra violet light lasts for less than about 5 minutes.

14. The method of claim 12 wherein said first silicon oxide via layer is formed by a plasma enhanced chemical vapor deposition process which causes said field inversion.

15. The method of claim 14 wherein said first silicon oxide layer has a thickness of between about 1000 to 4000 Angstroms.

16. The method of claim 12 wherein said polysilicon resistor structure within the said device is connected to said first metallurgy layer and is degraded due to said field inversion and has its normal resistance restored by said illumination.

17. The method of claim 14 wherein said chemical vapor deposition process has the conditions of low pressure, a temperature of about 400° C., silane and an oxidizing gas atmosphere.

18. The method of claim 12 wherein said spin-on-glass is a silicate type material and has an unetched thickness of between about 1500 to 3500 Angstroms when said second via layer is formed thereover.

19. The method of claim 12 wherein said spin-on-glass is a siloxane type material and has an unetched thickness of between about 1500 to 3500 Angstroms when said second via layer is formed thereover.

20. The method of claim 13 wherein said conditions of illumination has a doseage between about 5 watt-seconds/square cm. to 30 watt-seconds/square cm., said ultra violet wavelength is about 254 nanometers.

* * * * *